United States Patent [19]
Asada et al.

[11] Patent Number: 5,645,765
[45] Date of Patent: Jul. 8, 1997

[54] LEAD-FREE CONDUCTIVE PASTE

[75] Inventors: Eiichi Asada; Tetsuya Tanaka, both of Tokyo, Japan

[73] Assignee: Shoei Chemical Inc., Tokyo, Japan

[21] Appl. No.: 651,412

[22] Filed: May 22, 1996

[30] Foreign Application Priority Data

May 9, 1996 [JP] Japan ................. 8-114783

[51] Int. Cl.$^6$ ................ H01B 1/22; H01C 7/00
[52] U.S. Cl. ............... 252/518; 252/512; 252/513; 252/514; 501/32; 501/77; 501/78
[58] Field of Search ................ 252/512, 513, 252/514, 518; 501/32, 77, 78

[56] References Cited

U.S. PATENT DOCUMENTS

| | | | |
|---|---|---|---|
| 4,029,605 | 6/1977 | Kosiorek | 252/514 |
| 4,420,338 | 12/1983 | Ortega | 106/20 |
| 5,376,596 | 12/1994 | Tokuda et al. | 501/19 |
| 5,439,852 | 8/1995 | Hormadaly | 501/26 |
| 5,518,663 | 5/1996 | LaBrancha et al. | 252/514 |

FOREIGN PATENT DOCUMENTS

| | | |
|---|---|---|
| 62-53032 | 11/1987 | Japan . |
| 4-124077 | 4/1992 | Japan . |
| 4-39201 | 6/1992 | Japan . |

*Primary Examiner*—Paul Lieberman
*Assistant Examiner*—M. Kopec
*Attorney, Agent, or Firm*—Flynn, Thiel, Boutell & Tanis, P.C.

[57] ABSTRACT

A nontoxic lead-free conductive paste comprising (a) a lead-free glass frit having a crystallization temperature of 700°–870° C. and consisting essentially of, by weight %, 20–38% of $SiO_2$, 5.5–13.5% of $B_2O_3$, 8–15.5% of $Al_2O_3$, 4–19% of CaO, 20–29% of ZnO, 0–6% of $ZrO_2$, 4–16% of $TiO_2$ and 0.1–3.8% of $MoO_3$; (b) finely divided particles of electrically conductive material; (c) at least one inorganic additive selected from the group consisting of bismuth oxide, zinc oxide-containing containing oxide material, manganese oxide, copper oxide and molybdenum oxide; and (d) an organic medium. The nontoxic conductive paste is free from environmental and health problems and results in conductors having excellent solderability, solder leach resistance, adhesion strength and electrical properties, both on ceramic substrates such as alumina or on dielectric bodies.

10 Claims, No Drawings

LEAD-FREE CONDUCTIVE PASTE

BACKGROUND OF THE INVENTION

1. Field of the Invention

The present invention relates to thick film conductive pastes for microelectronic circuitry to form electrodes; electrical connections between resistors, capacitors or other electronic components and integrated circuits; or interconnections of multilayer ceramic modules; or the like.

More particularly, the present invention relates to conductive pastes in which any toxic lead frit system is not introduced for providing thick film conductors.

2. Description of the Prior Art

Conventional conductive pastes typically comprise; conductive particles such as noble metals, copper or nickel; inorganic binders such as glass and metal oxide additives; and an organic medium. Pastes are applied on insulating ceramic substrates such as alumina and on dielectrics and fired at high temperatures, e.g., 600°–1000° C.

For example, in the process of manufacture of thick film multilayer circuits, conductive pastes are fired usually at 800° C. to 900° C. and refired many times because thick film multilayer circuits are fabricated through repetition of printing and firing conductors, dielectrics, resistors and encapsulants.

Most existing thick film pastes contain lead compounds in the form of PbO-containing glass frit, PbO, $Pb_3O_4$, etc., as an essential ingredient. Experimental studies have established that lead compounds are essential for the strong adhesion of thick film conductors to alumina and to dielectrics as well as for good solder leach resistance.

However, the use of lead compounds are recently restricted both from the environmental point of view and due to their high health hazards, and will be banned in some areas in the near future.

It has been proposed to use lead-free glass frits, for example, containing $Bi_2O_3$ as a main ingredient. However, these glass frits have a low glass transition temperature (Tg) of lower than 550° C. So, it is estimated that conductive pastes with these glass frits are sintered overly when fired at a firing temperature of 800° C. to 900° C., for about 10 minutes. This process frequently results in poor thick film properties.

SUMMARY OF THE INVENTION

Accordingly, an object of the present invention is to provide a conductive paste which surmounts the aforementioned disadvantages and enables preparation of solderable thick film conductors having excellent properties both on ceramic substrates such as alumina or on dielectric bodies.

Another object of the present invention is to provide a conductive paste which is free from lead and firable under the conventional condition for production of thick film circuits.

Furthermore, a third object of the present invention is provide a conductive paste to prevent degradation of physical and electrical performance of circuits even after being repeatedly fired, particularly in the process of thick film multilayer circuits.

The invention is focused on a conductive paste containing a lead free crystallizable glass having a specific composition as an inorganic binder. More specifically, the invention is directed to a conductive paste which is free from lead, comprising:

(a) a lead-free glass frit having a crystallization temperature of 700°–870° C. and consisting essentially of, by weight %, 20–38% of $SiO_2$, 5.5–13.5% of $B_2O_3$, 8–15.5% of $Al_2O_3$, 4–19% of CaO, 20–29% of ZnO, 0–6% of $ZrO_2$, 4–16% of $TiO_2$ and 0.1–3.8% of $MoO_3$;

(b) finely divided particles of electrically conductive material;

(c) at least one inorganic additive selected from the group consisting of bismuth oxide, zinc oxide-containing oxide material, manganese oxide, copper oxide and molybdenum oxide; and (d) an organic medium in which all of the foregoing components (a), (b) and (c) are dispersed.

The objectives and features of the present invention will become clear from the following examples.

DETAILED DESCRIPTION OF THE PREFERRED EMBODIMENTS

GLASS FRIT

The basic composition of the glass of the invention consists essentially of, by weight %, 20–38% of $SiO_2$, 5.5–13.5% of $B_2O_3$, 8–15.5% of $Al_2O_3$, 4–19% of CaO, 20–29% of ZnO, 0–6% of $ZrO_2$, 4–16% of $TiO_2$ and 0.1–3.8% of $MoO_3$.

If the content of $SiO_2$ is less than 20% or more than 38%, the glass composition does not vitrify.

If the content of $B_2O_3$ is less than 5.5%, the glass composition does not vitrify. If the content of $B_2O_3$ exceeds 13.5%, the breakdown voltage of the thick film multilayer circuits deteriorates.

If the content of $Al_2O_3$ is less than 8%, glass bleeds out from the surface of the conductors applied on alumina substrates. If the content of $Al_2O_3$ exceeds 15.5%, the glass composition does not vitrify.

If the content of CaO is less than 4%, the glass composition does not vitrify. If the content of CaO exceeds 19%, bleeding-out of glass from the surface of the conductors on alumina and blistering occur on dielectrics.

If the content of ZnO is less than 20%, the breakdown voltage of the thick film multilayer circuits deteriorates. If the content of ZnO exceeds 29%, bleeding-out of glass from the conductors on alumina occurs.

If the content of $ZrO_2$ exceeds 6.0%, the crystallization temperature is higher than 870° C.

$TiO_2$ is added in the range of 4.0–16% to adjust the crystallization temperature of glass. If the content of $TiO_2$ is less than 4.0%, the crystallization temperature exceeds 870° C. If the content of $TiO_2$ exceeds 16%, the crystallization temperature is lower than 700° C.

If the content of $MoO_3$ is less than 0.1%, the aged adhesion strength on alumina deteriorates. If the content of $MoO_3$ exceeds 3.8%, the glass composition does not vitrify.

The glass frit used in the conductive paste of the present invention must be crystallized during the firing process, because the conductor used in the manufacture of thick film multilayer circuits are required to be consistent in properties throughout the multiple firing process. If a non-crystallizable glass frit is used, the glass often bleeds out from the conductor pattern when refired, resulting in over- and side-flow and degradation in solderability of the top conductor, and also the conductor pattern on a dielectric deforms due to the glass flow.

The crystallization temperature(Tc) of the glass should be within the range of 700°–870° C. by DTA (differential thermal analysis). Using a glass frit having a crystallization temperature below 700° C. brings about an insufficient densification of the conductor film due to too early crystallization. On the other hand, a glass frit having a crystallization temperature above 870° C. does not crystallize at the standard firing temperature of thick film, therefore, the glass bleeds out and the conductor pattern deforms after multiple firing.

The glass transition temperature(Tg) of the glass of the present invention is preferably within the range of 550°–680° C.

The glass frit is added to the conductive paste mainly to promote adhesion strength. It is desirable that the amount of the glass frit be 1.0–8.0% by weight of the total solid component [i.e., based on the total weight of the aforestated three components (a), (b) and (c)] of the paste. If the amount of the glass frit exceeds 8.0%, the conductors show tendency to bleeding-out of glass. Hereinafter, the term "solid component" is used to mean the above components (a), (b) and (c), excluding the organic medium (d) from the conductive paste, unless otherwise specified.

ELECTRICALLY CONDUCTIVE MATERIAL

Noble metal particles, such as Ag, Au, Pd, Pt, or mixtures and alloys thereof can be used in the practice of the invention. Non-noble metals such as Cu, and Ni, or mixtures or alloys thereof also can be used as the electrically conductive material singly or in combination thereof. Ag, Pd, Ag—Pd alloy or mixtures thereof is preferable.

Conductive particles must be of a size suitable for the method of application, usually screen printing, and at the same time they must be no larger than 20.0 μm, and preferably an average particle size is within the range of 1.0–5.0 μm to prevent both over-sintering and insufficient-sintering of the conductive paste.

The amount of the electrically conductive material will usually be 70–99% by weight of the solid component.

INORGANIC ADDITIVES

Besides the foregoing glass frit and conductive particles, one or more inorganic additives selected from among bismuth oxide, zinc oxide-containing oxide, copper oxide and molybdenum oxide are added.

Bismuth oxide added in a basic conductive paste to mainly prevent the deterioration of the adhesion strength and solderability of the resultant conductors. The amount of bismuth oxide is preferably in the range of 1.0–3.5% by weight of the solid component. If the bismuth oxide is less than 1.0%, tendency of bleeding-out of glass from the conductors on alumina increases and the solderability deteriorates. If the content of bismuth oxide exceeds 3.5%, solderability on alumina worsens.

The zinc oxide-containing oxide material is selected from ZnO and ZnO—CoO-containing solid solutions, e.g., ZnO—CoO solid solution, ZnO—CoO—MgO solid solution, and ZnO—CoO—NiO—TiO$_2$ solid solution. The zinc oxide-containing oxide material is added, preferably in the range of 0.2–2.0% by weight of the solid component, to prevent the conductors on alumina from blistering. If the content of the zinc oxide-containing oxide material exceeds 2.0%, the conductors on dielectrics are considerably deteriorated in solderability.

Manganese oxide is added, preferably in an amount of 0.2 to 1.5% by weight of the solid component, to a conductive paste to prevent the conductors on alumina from blistering and lowering in the aged adhesion strength. If the content of manganese oxide exceeds 1.5%, the conductors on dielectrics are considerably lowered in solderability.

Copper oxide may be in either in the form of CuO or Cu$_2$O, and is added in a range of 0.2–1.0% by weight of the solid component to mainly prevent the multilayered circuit from decreasing the breakdown voltage.

Molybdenum oxide is added to increase the solderability on alumina, and to prevent the conductors from bleeding-out of glass. A preferred content of molybdenum oxide is 0.2–1.0% by weight of the solid component. If the content of molybdenum oxide exceeds 1.0%, the breakdown voltage of the multilayered circuit is lowered.

All of inorganic additives are added in a finely divided form to the paste.

ORGANIC MEDIUM

Any one of organic media heretofore used for thick film pastes may also be used in the paste of the present invention and such examples include alcohols, esters, ethers, terpenes, and solutions of various resins.

The amount of the organic medium will usually be 10–40% by weight on a paste basis.

PASTE PREPARATION

The aforestated glass frit, electrically conductive material and inorganic additives are mixed together and dispersed in the organic medium in a conventional manner, typically using a three-roll mill, to prepare the conductive paste which can be printed in a desired pattern.

In the present invention, the optimal conductor properties can be obtained with a paste composition consisting of, in weight percentages, 83–97% conductive powder, 1.0–8.0% of glass frit, 1.0–3.5% of Bi$_2$O$_3$, 0.2–2.0% of ZnO-containing oxide material, 0.2–1.5% of MnO$_2$, 0.2–1.0% of copper oxide, and 0.2–1.0% of MoO$_3$.

In this application, glass transition temperature(Tg) and crystallization temperatures(Tc) are indicated by those measured by DTA, unless otherwise specified.

EXAMPLES

Preparation of glass frits was conducted in the following manner:

The batch ingredients, SiO$_2$, B$_2$O$_3$, Al(OH)$_3$, CaCO3, ZnO, ZrO$_2$, TiO$_2$ and MoO$_3$ were weighed and mixed so as to prepare glasses each having a composition as shown in TABLE 1. Each of resultant mixture was fused at a peak temperature of 1300°–1400° C. for a period of 1.0–1.5 hours. The melted compound was then poured into cold water to get a vitreous material. The vitreous material was ground into frit having an average particle size of about 3 μm by ball milling for 20–24 hours using alumina balls. The glass transition temperature and crystallization temperature measured for each glass frit by DTA are also shown in TABLE 1.

TABLE 1

| No. | SiO$_2$ | B$_2$O$_3$ | Al$_2$O$_3$ | CaO | ZnO | ZrO$_2$ | TiO$_2$ | MoO$_3$ | PbO | SnO$_2$ | Tg (°C.) | Tc (°C.) |
|---|---|---|---|---|---|---|---|---|---|---|---|---|
| 1 | 24.6 | 9.6 | 13.7 | 12.4 | 25.3 | 1.4 | 9.2 | 3.8 | — | — | 609 | 756/826 |
| 2 | 28.4 | 5.8 | 13.7 | 12.4 | 25.3 | 1.4 | 9.2 | 3.8 | — | — | 636 | 787/848 |
| 3 | 28.7 | 5.8 | 12.4 | 12.5 | 25.5 | 2.9 | 9.3 | 2.9 | — | — | 627 | 801/865 |
| 4* | 28.6 | 4.9 | 13.8 | 12.0 | 27.0 | 1.5 | 9.3 | 2.9 | — | — | not vitrified | |
| 5* | 33.3 | 5.8 | 7.8 | 12.5 | 25.5 | 2.9 | 9.3 | 2.9 | — | — | 635 | 826 |
| 6 | 25.6 | 5.8 | 15.5 | 12.5 | 25.5 | 2.9 | 9.3 | 2.9 | — | — | 625 | 796/846 |
| 7* | 29.4 | 6.0 | 12.8 | 12.9 | 26.3 | 3.0 | 9.6 | — | — | — | 639 | 829 |
| 8 | 28.7 | 5.8 | 12.4 | 12.5 | 25.5 | 5.8 | 6.4 | 2.9 | — | — | 643 | 865 |
| 9 | 33.1 | 5.8 | 14.1 | 12.5 | 19.4 | 2.9 | 9.3 | 2.9 | — | — | 643 | 817 |
| 10* | 25.2 | 13.6 | 9.7 | 12.5 | 27.2 | 1.5 | 7.4 | 2.9 | — | — | 600 | 778/850 |
| 11 | 28.7 | 5.8 | 12.4 | 12.5 | 25.5 | — | 12.2 | 2.9 | — | — | 623 | 736/851 |
| 12* | 28.7 | 5.8 | 13.9 | 16.4 | 25.5 | 2.9 | 3.9 | 2.9 | — | — | 644 | 872 |
| 13* | 33.2 | 8.2 | 14.1 | 3.9 | 25.5 | 2.9 | 9.3 | 2.9 | — | — | not vitrified | |
| 14 | 31.3 | 8.2 | 14.1 | 5.8 | 25.5 | 2.9 | 9.3 | 2.9 | — | — | 613 | 709/783 |
| 15 | 28.7 | 5.8 | 12.4 | 7.7 | 25.5 | 1.5 | 15.5 | 2.9 | — | — | 648 | 707/826 |
| 16* | 24.8 | 5.8 | 12.4 | 19.4 | 25.5 | 1.5 | 7.7 | 2.9 | — | — | 626 | 810/913 |
| 17* | 38.9 | 5.8 | 9.7 | 9.7 | 25.5 | 1.5 | 6.0 | 2.9 | — | — | not vitrified | |
| 18 | 36.9 | 5.8 | 11.7 | 9.7 | 25.5 | 1.5 | 6.0 | 2.9 | — | — | 637 | 770 |
| 19* | 19.5 | 9.7 | 15.6 | 14.6 | 25.5 | 2.9 | 9.3 | 2.9 | — | — | not vitrified | |
| 20* | 22.4 | 5.8 | 9.7 | 29.1 | 25.5 | 1.5 | 3.1 | 2.9 | — | — | 643 | 843 |
| 21* | 24.2 | 9.7 | 9.6 | 14.5 | 30.0 | 1.4 | 7.7 | 2.9 | — | — | 600 | 790 |
| 22 | 25.1 | 11.7 | 13.6 | 10.2 | 27.2 | 1.5 | 7.4 | 2.9 | — | — | 606 | 800 |
| 23 | 33.3 | 5.8 | 9.7 | 10.6 | 26.2 | 1.9 | 9.6 | 2.9 | — | — | 626 | 786/863 |
| 24 | 33.0 | 5.8 | 14.1 | 10.6 | 21.4 | 2.9 | 9.3 | 2.9 | — | — | 630 | 770/843 |
| 25* | 24.0 | 2.6 | 13.4 | 12.2 | 15.8 | 0.9 | 9.1 | 5.6 | 16.1 | 0.3 | 617 | 735/884 |

*comparative glass compositions outside the scope of the present invention

The resultant glass frits were then mixed using a three-roll mill with Ag—Pd alloy powder, inorganic additives and an organic medium to prepare conductive pastes. The Ag content in the Ag—Pd alloy powder was about 80% by weight. The organic medium used was composed of 17% by weight of ethyl cellulose and 83% by weight of α-terpineol and dibutyl phthalate. Each paste was adjusted to bring the viscosity to 200–250 Pa.S at a shear rate of 4 sec.

The proportion of each ingredient is shown in TABLES 2 to 5. In TABLES 2 to 5, ZnO-containing oxide is 85 mol% ZnO-2 mol% CoO-13 mol % MgO solid solution and the organic medium was added in such a proportion that the total of each paste including it was 100% by weight.

Using a 250 mesh screen, each conductive paste was screen-printed in a square pattern of 1 inch×1 inch on an alumina substrate and a square pattern of 2 inches×2 inches on a lead-free glass-ceramic dielectric essentially consisting of SiO$_2$, B$_2$O$_3$, Al$_2$O$_3$, MgO and ZnO, and then fired at 850° C. for 10 minutes to form specimens with thick film conductors.

For each alumina specimen, sheet resistivity, solder leach resistance, solderability, initial adhesion strength, aged adhesion strength after aging at 150° C. for 48 hours and bleeding-out of glass were measured.

For each dielectric specimen, insulation resistance, breakdown voltage, solder leach resistance, solderability, initial adhesion strength and adhesion strength after the foregoing aging were measured.

Results are shown in TABLE 2 to TABLE 5.

Tests and evaluations were carried out as following:

Solder leach resistance; the conductor layer was exposed until being eroded to test cycles, each cycle consists of dipping in a mild-activation flux, a 10 second dipping in a 62Sn/36Pb/2Ag soldering bath of 230° C. and washing off flux residue.

Solderability; the degree of wetting with a smooth solder after a 5 second dipping in the 62Sn/36Pb/2Ag soldering bath of 230° C. using the mild-activation flux.

Initial adhesion strength and aged adhesion strength; measured with a 2 mm×2 mm conductor pattern pad.

Insulation resistance and breakdown voltage properties; measured for test pieces having a sandwiched dielectric structure (i.e., top Ag—Pd conductor/dielectric of 38 μm in thickness/bottom Ag—Pd conductor). Insulation resistance was calculated from the flowing current when a DC voltage of 100 V was applied between the two conductor pads separated by the dielectric. Breakdown voltage was the DC voltage applied between the two conductor pads when the sensitive current shows 1 mA.

TABLE 2

| | Example No. | | | | | | | |
|---|---|---|---|---|---|---|---|---|
| | 1 | 2 | 3* | 4 | 5 | 6 | 7 | 8 |
| Ag/Pd Conductive Paste Composition (wt %) | | | | | | | | |
| Ag—Pd alloy powder | 78.5 | 78.5 | 78.5 | 78.5 | 78.5 | 78.5 | 78.5 | 78.5 |
| Glass No. | 1 | 2 | 5 | 6 | 3 | 11 | 14 | 18 |
| Glass amount | 3.5 | 3.5 | 3.5 | 3.5 | 3.5 | 3.5 | 3.5 | 3.5 |
| Bi$_2$O$_3$ | 2.0 | 2.0 | 2.0 | 2.0 | 2.0 | 2.0 | 2.0 | 2.0 |

TABLE 2-continued

|  | Example No. | | | | | | | |
|---|---|---|---|---|---|---|---|---|
|  | 1 | 2 | 3* | 4 | 5 | 6 | 7 | 8 |
| ZnO-containing oxide | 0.4 | 0.4 | 0.4 | 0.4 | 0.4 | 0.4 | 0.4 | 0.4 |
| $MnO_2$ | 0.8 | 0.8 | 0.8 | 0.8 | 0.8 | 0.8 | 0.8 | 0.8 |
| CuO | 0.8 | 0.8 | 0.8 | 0.8 | 0.8 | 0.8 | 0.8 | 0.8 |
| $MoO_3$ | 0.4 | 0.8 | 0.8 | 0.8 | 0.8 | 0.8 | 0.8 | 0.8 |
| Organic medium | bal. | bal. | bal. | bal. | bal. | bal. | bal. | bal. |
| Properties on alumina | | | | | | | | |
| Rs*[1] | 12.5 | 12.3 | 12.8 | 12.5 | 13.4 | 12.0 | 12.2 | 11.9 |
| S.L.R.*[2] | 10–11 | 10–11 | 10–11 | 11 | 11 | 10–11 | 10 | 9–10 |
| Solderability | ○ | ○ | ○ | ○ | ○ | ○ | ○ | ○ |
| Adhesion(kg) | | | | | | | | |
| initial | 4.2 | 4.0 | 4.2 | 4.2 | 4.1 | 4.7 | 4.6 | 4.6 |
| aged | 2.5 | 3.0 | 2.4 | 2.3 | 2.5 | 2.1 | 2.2 | 2.1 |
| Bleed-out | ○ | ○ | x | ○ | ○ | ○ | ○ | ○ |
| Properties on dielectric | | | | | | | | |
| I.R.*[3] | 15.6 | 9.4 | 11.4 | 11.0 | 20.0 | 17.2 | 11.1 | 9.5 |
| B.D.V.*[4] | 2533 | 3125 | 2925 | 2783 | 3325 | 3783 | 3658 | 3375 |
| S.L.R.*[2] | 11 | 10 | 10 | 11 | 11 | 10 | 10 | 10 |
| Solderability | ○ | ○ | ○ | ○ | ○ | ○ | ○ | ○ |
| Adhesion(kg) | | | | | | | | |
| initial | 2.0 | 2.2 | 4.0 | 4.4 | 2.3 | 4.4 | 4.1 | 4.5 |
| aged | 3.0 | 3.5 | 3.9 | 4.3 | 3.3 | 3.7 | 3.9 | 4.1 |

TABLE 3

|  | Example No. | | | | | | | |
|---|---|---|---|---|---|---|---|---|
|  | 9 | 10 | 11 | 12 | 13 | 14 | 15* | 16* |
| Ag/Pd Conductive Paste Composition (wt %) | | | | | | | | |
| Ag-Pd alloy powder | 78.5 | 78.5 | 78.5 | 78.5 | 78.5 | 78.5 | 78.5 | 78.5 |
| Glass No. | 22 | 23 | 24 | 3 | 8 | 15 | 7 | 12 |
| Glass amount | 3.5 | 3.5 | 3.5 | 3.5 | 3.5 | 3.5 | 3.5 | 3.5 |
| $Bi_2O_3$ | 2.0 | 2.0 | 2.0 | 2.0 | 2.0 | 2.0 | 2.0 | 2.0 |
| ZnO-containing oxide | 0.4 | 0.4 | 0.4 | 0.4 | 0.4 | 0.4 | 0.4 | 0.4 |
| $MnO_2$ | 0.8 | 0.8 | 0.8 | 0.8 | 0.8 | 0.8 | 0.8 | 0.8 |
| CuO | 0.8 | 0.8 | 0.8 | 0.8 | 0.8 | 0.8 | 0.8 | 0.8 |
| $MoO_3$ | 0.8 | 0.8 | 0.8 | 0.8 | 0.8 | 0.8 | 0.8 | 0.8 |
| Organic medium | bal. | bal. | bal. | bal. | bal. | bal. | bal. | bal. |
| Properties on alumina | | | | | | | | |
| Rs*[1] | 12.9 | 11.9 | 12.7 | 12.5 | 12.3 | 12.5 | 12.3 | 12.1 |
| S.L.R.*[2] | 11–12 | 10–11 | 10–11 | 11–1 | 11–12 | 10 | 11 | 10 |
| Solderability | ○ | ○ | ○ | ○ | ○ | ○ | ○ | ○ |
| Adhesion (kg) | | | | | | | | |
| initial | 4.7 | 4.6 | 4.7 | 4.6 | 4.3 | 4.6 | 4.4 | 4.7 |
| aged | 3.0 | 3.4 | 2.8 | 2.5 | 2.0 | 2.4 | 1.9 | 1.7 |
| Bleed-out | ○ | ○ | ○ | ○ | ○ | ○ | ○ | ○ |
| Properties on dielectric | | | | | | | | |
| I.R.*[3] | 19.3 | 17.3 | 15.7 | 13.3 | 8.4 | 12.8 | 11.5 | 19.8 |
| B.D.V.*[4] | 3608 | 3425 | 2833 | 2750 | 2583 | 3283 | 2825 | 3275 |
| S.L.R.*[2] | 11 | 10 | 10 | 11–12 | 11 | 10 | 11 | 10 |
| Solderability | ○ | ○ | ○ | ○ | ○ | ○ | ○ | Δ |
| Adhesion (kg) | | | | | | | | |
| initial | 4.2 | 4.5 | 3.9 | 3.7 | 3.3 | 4.6 | 3.7 | 4.0 |
| aged | 4.0 | 4.1 | 4.0 | 4.0 | 3.3 | 3.8 | 3.4 | 3.9 |

TABLE 4

|  | Example No. | | | | | | | |
| --- | --- | --- | --- | --- | --- | --- | --- | --- |
|  | 17* | 18* | 19* | 20* | 21* | 22 | 23* | 24 |
| Ag/Pd Conductive Paste Composition (wt %) | | | | | | | | |
| Ag—Pd alloy powder | 78.5 | 78.5 | 78.5 | 78.5 | 78.5 | 78.5 | 78.5 | 78.5 |
| Glass No. | 9 | 10 | 16 | 20 | 21 | 3 | 3 | 3 |
| Glass amount | 3.5 | 3.5 | 3.5 | 3.5 | 3.5 | 3.5 | 2.4 | 3.5 |
| $Bi_2O_3$ | 2.0 | 2.0 | 2.0 | 2.0 | 2.0 | 3.1 | 2.0 | 2.0 |
| ZnO-containing oxide | 0.4 | 0.4 | 0.4 | 0.4 | 0.4 | 0.4 | 0.4 | 1.6 |
| $MnO_2$ | 0.8 | 0.8 | 0.8 | 0.8 | 0.8 | 0.8 | 0.8 | 0.8 |
| CuO | 0.8 | 0.8 | 0.8 | 0.8 | 0.8 | 0.8 | 0.8 | 0.8 |
| $MoO_3$ | 0.8 | 0.8 | 0.8 | 0.8 | 0.8 | 0.8 | 0.8 | 0.8 |
| Organic medium | bal. | bal. | bal. | bal. | bal. | bal. | bal. | bal. |
| Properties on alumina | | | | | | | | |
| Rs*[1] | 13.4 | 12.8 | 11.6 | 11.8 | 12.1 | 13.0 | 12.4 | 15.2 |
| S.L.R.*[2] | 11 | 10–11 | 10 | 9 | 12 | 11 | 10–13 | 12 |
| Solderability | o | o | o | o | o | o | o | o |
| Adhesion(kg) | | | | | | | | |
| initial | 4.3 | 4.4 | 4.6 | 4.7 | 4.6 | 4.6 | 4.5 | 4.8 |
| aged | 2.3 | 3.0 | 1.4 | 1.6 | 2.5 | 2.8 | 2.0 | 2.3 |
| Bleed-out | o | o | o | x | x | o | o | o |
| Properties on dielectric | | | | | | | | |
| I.R.*[3] | 7.6 | 7.9 | 11.2 | 15.2 | 15.3 | 14.8 | 13.2 | 13.9 |
| B.D.V.*[4] | 2075 | 2408 | 2633 | 2733 | 2783 | 3158 | 3525 | 2883 |
| S.L.R.*[2] | 11 | 10 | 10 | 9 | 12 | 11 | 11 | 12 |
| Solderability | o | o | o | o | o | o | o | o |
| Adhesion (kg) | | | | | | | | |
| initial | 3.8 | 3.8 | 3.9 | 3.7 | 4.2 | 4.6 | 4.4 | 2.8 |
| aged | 3.6 | 3.6 | 4.0 | 3.8 | 3.9 | 4.0 | 3.9 | 3.0 |

TABLE 5

|  | Example No. | | | | | | |
| --- | --- | --- | --- | --- | --- | --- | --- |
|  | 25 | 26 | 27 | 28 | 29 | 30 | 31* |
| Ag/Pd Conductive Paste Composition (wt %) | | | | | | | |
| Ag—Pd alloy | 78.5 | 78.5 | 78.5 | 78.5 | 78.5 | 78.5 | 78.5 |
| Glass No. | 3 | 3 | 3 | 3 | 3 | 3 | 25 |
| Glass amount | 3.5 | 3.5 | 3.5 | 3.5 | 4.7 | 3.5 | 3.5 |
| $Bi_2O_3$ | 2.0 | 2.0 | 2.0 | 0.8 | 2.0 | 2.0 | 2.0 |
| ZnO-containing oxide | 0 | 0.4 | 0.4 | 0.4 | 0.4 | 0.4 | 0.4 |
| $MnO_2$ | 0.8 | 0.8 | 0.8 | 0.8 | 1.2 | 0.8 |  |
| CuO | 0.8 | 0.8 | 0.2 | 0.8 | 0.8 | 0.8 | 0.8 |
| $MoO_3$ | 0.8 | 0.8 | 0.8 | 0.8 | 0.8 | 0.8 | 0.8 |
| Organic medium | bal. | bal. | bal. | bal. | bal. | bal. | bal. |
| Properties on alumina | | | | | | | |
| Rs*[1] | 14.0 | 12.1 | 14.7 | 12.8 | 14.1 | 14.7 | 14.5 |
| S.L.R.*[2] | 11 | 10 | 12 | 11–12 | 11 | 12 | 8–9 |
| Solderability | o | o | o | o | o | o | o |
| Adhesion(kg) | | | | | | | |
| initial | 4.6 | 4.6 | 4.6 | 4.5 | 4.6 | 4.4 | 4.3 |
| aged | 2.0 | 2.0 | 2.2 | 2.0 | 2.8 | 4.1 | 2.0 |
| Bleed-out | o | o | o | Δ | o | o | o |
| Properties on dielectric | | | | | | | |
| I.R.*[3] | 13.4 | 18.2 | 10.1 | 15.5 | 17.0 | 15.6 | 7.7 |
| B.D.V.*[4] | 3200 | 3683 | 2520 | 3667 | 3350 | 2667 | 3358 |
| S.L.R.*[2] | 11 | 10 | 12 | 11 | 11 | 12 | 8–9 |
| Solderability | o | o | o | o | o | o | Δ |

TABLE 5-continued

|  | Example No. | | | | | | |
| --- | --- | --- | --- | --- | --- | --- | --- |
|  | 25 | 26 | 27 | 28 | 29 | 30 | 31* |
| Adhesion(kg) | | | | | | | |
| initial | 4.5 | 4.0 | 3.7 | 4.3 | 4.5 | 3.0 | 3.2 |
| aged | 4.1 | 2.8 | 3.8 | 4.3 | 3.9 | 4.2 | 3.7 |

Notes:
*comparative specimens
*[1]sheet resistivity (mΩ/square)
*[2]solder leach resistance (cycles)
*[3]insulation resistance (×10$^{12}$ Ω)
*[4]breakdown voltage (V)
o: excellent results, x: poor results,
Δ: slightly poor results As will be understood from the data for examples Nos.1, 2, 4–14, 22–30, the thick film conductors made from the pastes of the present invention had high adhesion strength even after aging at 150° C. for 48 hours, both on the alumina and dielectric, and high solder leach resistance.

As for insulation resistance and breakdown voltage, there were obtained excellent properties of >10 12 Ω and >2500 V, respectively, which were well comparable to or better than those of presently used compositions containing lead compounds.

Examples Nos. 3, 15–21 and 31 are comparative examples.

As described above, since the conductive paste of the present invention is free of toxic lead, it does not cause any environmental or health problem. Further, this nontoxic paste can be fired under conventional thick film production conditions and provide conductors having an advantageous combination of properties when being applied onto a ceramic or dielectric substrate. The resultant conductors are not subject to any significant change in properties due to repeated firing steps.

What is claimed is:

1. A conductive paste for forming a thick film conductor comprising:

(a) a lead-free glass frit having a crystallization temperature of 700°–870° C. and consisting essentially of, by weight %, 20–38% of $SiO_2$, 5.5–13.5% of $B_2O_3$, 8–15.5% of $Al_2O_3$, 4–19% of CaO, 20–29% of ZnO, 0–6% of $ZrO_2$, 4–16% of $TiO_2$ and 0.1–3.8% of $MoO_3$;

(b) finely divided particles of electrically conductive material;

(c) at least one inorganic additive selected from the group consisting of bismuth oxide, zinc oxide-containing oxide material, manganese oxide, copper oxide and molybdenum oxide; and (d) an organic medium in which all of said components (a), (b) and (c) are dispered.

2. The conductive paste of claim 1, wherein said electrically conductive material is at least one selected from the group consisting of Ag, Au, Pd, Pt, Cu, Ni and alloys of the aforesaid metals.

3. The conductive paste of claim 1, wherein said electrically conductive material is Ag, Pd, Ag—Pd alloy or mixtures thereof.

4. The conductive paste of claim 1, wherein said glass frit is 1.0–8.0% by weight of the total solid component thereof consisting of said components (a), (b) and (c).

5. The conductive paste of claim 1, wherein said bismuth oxide is 1.0–3.5% by weight of the total solid component thereof.

6. The conductive paste of claim 1, wherein said zinc oxide-containing oxide material is 0.2–2.0% by weight of the total solid component thereof.

7. The conductive paste of claim 6, wherein said zinc oxide-containing oxide material is at least one selected from the group consisting of ZnO and ZnO—CoO— containing solid solutions.

8. The conductive paste of claim 1, wherein said manganese oxide is 0.2–1.5% by weight of the total solid component thereof.

9. The conductive paste of claim 1, wherein said copper oxide is 0.2–1.0% by weight of the total solid component thereof.

10. The conductive paste of claim 1, wherein said molybdenum oxide is 0.2–1.0% by weight of the total solid component thereof.

* * * * *

UNITED STATES PATENT AND TRADEMARK OFFICE
CERTIFICATE OF CORRECTION

PATENT NO. : 5,645,765
DATED : July 8, 1997
INVENTOR(S) : Eiichi ASADA et al

It is certified that error appears in the above-indentified patent and that said Letters Patent is hereby corrected as shown below:

Column 12, line 22, change "dispered" to ---dispersed---.

Signed and Sealed this

Fourth Day of November, 1997

Attest:

BRUCE LEHMAN

Attesting Officer       Commissioner of Patents and Trademarks